（12) United States Patent
Zhou et al.

(10) Patent No.: US 10,950,666 B2
(45) Date of Patent: Mar. 16, 2021

(54) PIXEL STRUCTURE, OLED DISPLAY SCREEN AND EVAPORATION MASK

(71) Applicant: KUNSHAN GO-VISIONOX OPTO-ELECTRONICS CO., LTD., Kunshan (CN)

(72) Inventors: Lifang Zhou, Kunshan (CN); Junfeng Li, Kunshan (CN); Mingxing Liu, Kunshan (CN); Xuliang Wang, Kunshan (CN); Feng Gao, Kunshan (CN)

(73) Assignee: KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 0 days.

(21) Appl. No.: 16/676,610

(22) Filed: Nov. 7, 2019

(65) Prior Publication Data

US 2020/0075691 A1   Mar. 5, 2020

Related U.S. Application Data

(63) Continuation of application No. PCT/CN2018/090013, filed on Jun. 5, 2018.

(30) Foreign Application Priority Data

Aug. 31, 2017  (CN) .......................... 201710776286.6

(51) Int. Cl.
*H01L 29/08* (2006.01)
*H01L 33/00* (2010.01)
(Continued)

(52) U.S. Cl.
CPC ........ *H01L 27/3218* (2013.01); *H01L 27/326* (2013.01); *H01L 27/3211* (2013.01); *H01L 27/3216* (2013.01); *H01L 51/0011* (2013.01)

(58) Field of Classification Search
CPC ............... H01L 27/3218; H01L 27/326; H01L 27/3216; H01L 51/0011; H01L 27/3211
See application file for complete search history.

(56) References Cited

U.S. PATENT DOCUMENTS 9,837,473 B2 * 12/2017 Kim .................... H01L 27/3216
10,026,785 B2 * 7/2018 Bai ..................... H01L 27/3218
(Continued)

FOREIGN PATENT DOCUMENTS

CN        103311266 A       9/2013
CN        104465714 A       3/2015
(Continued)

OTHER PUBLICATIONS

Office Action dated Apr. 2, 2020 in corresponding Chinese Application No. 201710776286.6; 13 pages including English-language translation.
(Continued)

*Primary Examiner* — Alonzo Chambliss
(74) *Attorney, Agent, or Firm* — Maier & Maier, PLLC

(57) ABSTRACT

The present disclosure provides a pixel structure, an OLED display screen, and an evaporation mask. The pixel structure includes a plurality of pixel unit groups arranged in an array. Each of the pixel unit groups includes a first sub-pixel, a second sub-pixel and a third sub-pixel. An edge of the first sub-pixel close to the third sub-pixel is not parallel to an edge of the first sub-pixel away from the third sub-pixel. An edge of the second sub-pixel close to the third sub-pixel is not parallel to an edge of the second sub-pixel away from the third sub-pixel. At least two adjacent first sub-pixels and/or at least two adjacent second sub-pixels of at least two adjacent pixel unit groups are formed by a same mask opening in the evaporation mask.

14 Claims, 11 Drawing Sheets

(51) Int. Cl.
*H01L 31/0232* (2014.01)
*H01L 21/00* (2006.01)
*H01L 27/32* (2006.01)
*H01L 51/00* (2006.01)

(56) References Cited

U.S. PATENT DOCUMENTS

| | | | |
|---|---|---|---|
| 2009/0302331 A1* | 12/2009 | Smith | G09G 3/3208 257/88 |
| 2015/0021637 A1* | 1/2015 | Ahn | H01L 27/3218 257/89 |
| 2016/0126298 A1* | 5/2016 | Chen | H01L 27/3218 257/40 |
| 2016/0358985 A1* | 12/2016 | Bai | G09G 3/3208 |
| 2019/0058017 A1* | 2/2019 | Du | C23C 14/12 |
| 2019/0237518 A1* | 8/2019 | Sun | H01L 27/3216 |

FOREIGN PATENT DOCUMENTS

| | | |
|---|---|---|
| CN | 104659064 A | 5/2015 |
| CN | 105529353 A | 4/2016 |
| CN | 105552099 A | 5/2016 |
| CN | 107086239 A | 8/2017 |
| KR | 20090021580 A | 3/2009 |
| TW | 201442223 A | 11/2014 |

OTHER PUBLICATIONS

International Search Report dated Aug. 31, 2018 in corresponding International Application No. PCT/CN2018/090013; 4 pages.
Chinese Office Action dated Sep. 3, 2019 in corresponding Chinese Application No. 201710776286.6; 17 pages.
Taiwanese Office Action dated Apr. 29, 2019 in corresponding Taiwanese Application No. 107120047; 9 pages; Partial translation attached.

* cited by examiner

PIXEL STRUCTURE, OLED DISPLAY SCREEN AND EVAPORATION MASK

FIELD

The present disclosure relates to the field of display technologies, and particularly, to a pixel structure, an OLED display screen having the pixel structure, and an evaporation mask.

BACKGROUND

An Organic Light-Emitting Diode (OLED) is an active light-emitting device. Compared with the conventional Liquid Crystal Display (LCD) display mode, the OLED display technology does not require a backlight and has self-luminous characteristics. The OLED adopts a thinner organic material film and a glass substrate, and the organic material emits light when electric current passes through. Therefore, an OLED display screen can significantly save power, can be made lighter and thinner, can withstand a wider range of temperature changes than an LCD display screen, and has a wider viewing angle. The OLED display screen is expected to be the next-generation flat panel display technology after the LCD, and has become one of the most popular technologies in the current flat panel display technology.

Many colorization methods are applied to OLED display screens. At present, OLED evaporation technology is a main technology of OLED colorization technology, which is relatively mature and has been successfully used in mass production. The OLED evaporation technology applies the conventional RGB Stripe arrangements for evaporation, among which the side-by-side arrangement has the best image effect. In the side-by-side arrangement, three sub-pixels of Red, Green, and Blue (R, G, B) exist in the region of a pixel, each sub-pixel is rectangular and has an independent organic light-emitting component, and the organic light-emitting component is formed at a position corresponding to pixels on an array substrate through using a Fine Metal Mask (FMM) under evaporation. The FMM is generally referred to as an evaporation mask or a metal mask. The technology of producing OLED display screens with high Pixel Per Inch (PPI) focuses on fine and mechanically stable FMMs and pixel arrangements.

FIG. 1 is a schematic diagram showing pixel arrangement of an OLED display screen in the background art. As shown in FIG. 1, the OLED display panel adopts a pixel side-by-side arrangement. Each pixel unit includes an R sub-pixel region 101, a G sub-pixel region 103, and a B sub-pixel region 105, where the R sub-pixel region 101 includes an R light-emitting region 102 and an R non-light-emitting region, the G sub-pixel region 103 includes a G light-emitting region 104 and a G non-light-emitting region, and the B sub-pixel region 105 includes a B light-emitting region 106 and a B non-light-emitting region. As shown in FIG. 1, the R, G, and B sub-pixels are rectangular, and the areas of the light-emitting regions are equal, and the R, G, and B sub-pixels are arranged in a straight line. The light-emitting region of each sub-pixel region includes a cathode, an anode, and an electroluminescent layer (also called an organic light-emitting layer), where the electroluminescent layer is located between the cathode and the anode for generating light of a predetermined color to achieve display. In the preparation of the display screen, it is generally necessary to utilize a three-time evaporation process to form electroluminescent layers of corresponding colors in the light-emitting regions of the corresponding color pixel regions, respectively.

The OLED display panel shown in FIG. 1 is generally evaporated by using the FMM shown in FIG. 2. The FMM includes a shielding region 107 and a plurality of evaporation openings 108, and the portion of the shielding region between two adjacent evaporation openings 108 in the same column is called a bridge. In order to avoid the shadowing effect to the sub-pixels during evaporation, a sufficient distance has to be maintained between the sub-pixels and the bridge, which causes decrease in the lengths of the sub-pixels, and affects the aperture ratio of each sub-pixel. The conventional RGB side-by-side pixel arrangement can only reach 200-300 PPI at most, which is difficult to achieve the high-resolution display effect. With the increasing demands of users to the resolution of the OLED display panel, this sort of RGB pixel side-by-side arrangement can no longer meet the design requirements of the product with high PPI.

SUMMARY

The applicant has found through research that the conventional RGB pixel arrangement cannot meet both the requirements of the aperture ratio and display effect of the product. On this basis, the present disclosure provides a pixel structure of an OLED display screen, and the OLED display screen, and an evaporation mask for solving the problems.

In order to solve the foregoing technical problems, the present disclosure provides a pixel structure, comprising a plurality of pixel unit groups arranged in an array.

Each of the pixel unit groups comprises a first sub-pixel, a second sub-pixel and a third sub-pixel. An edge of the first sub-pixel close to the third sub-pixel is not parallel to an edge of the first sub-pixel away from the third sub-pixel, and an edge of the second sub-pixel close to the third sub-pixel is not parallel to an edge of the second sub-pixel away from the third sub-pixel.

At least two adjacent first sub-pixels and/or at least two adjacent second sub-pixels of at least two adjacent pixel unit groups are formed by a same mask opening in an evaporation mask.

Alternatively, in the pixel structure, each of the pixel unit groups comprises two first sub-pixels, two second sub-pixels, and one third sub-pixel; each of the pixel unit groups comprises at least two pixel units formed by one first sub-pixel, one second sub-pixel, and one third sub-pixel; and the pixel units in each of the pixel unit groups share the third sub-pixel.

Alternatively, in the pixel structure, the first sub-pixel, the second sub-pixel, and the third sub-pixel are all polygonal structures.

Alternatively, in the pixel structure, the first sub-pixel and the second sub-pixel have a shape of right-angled trapezoid, and the third sub-pixel has a shape of rhombus or hexagon; the right-angled trapezoid has an oblique waist close to the third sub-pixel, the right-angled trapezoid has a right-angled waist away from the third sub-pixel; and each of the pixel unit groups has a shape of rectangle or square.

Alternatively, in the pixel structure, the first sub-pixel and the second sub-pixel in each of the pixel unit groups are arranged around the third sub-pixel, and the third sub-pixels in the pixel unit groups of adjacent rows are arranged in a staggered manner. The third sub-pixels in the pixel unit groups of adjacent rows are staggered by a distance half of the pixel unit group. In the pixel unit groups of adjacent rows, orientations of acute angles of the right-angled trapezoids of adjacent first pixels are different, and orientations of acute angles of the right-angled trapezoids of adjacent second pixels are different.

Alternatively, in the pixel structure, the first sub-pixel and the second sub-pixel in each of the pixel unit groups are arranged around the third sub-pixel, the third sub-pixels in the pixel unit groups of adjacent rows are arranged in an aligned manner, and two adjacent pixel unit groups in the column and/or row direction are symmetrically distributed with respect to the boundary therebetween. In the pixel unit groups of adjacent rows, orientations of acute angles of the right-angled trapezoids of adjacent first pixels are the same, and orientations of acute angles of the right-angled trapezoids of adjacent second pixels are the same.

Alternatively, in the pixel structure, the first sub-pixels in each of the pixel unit groups are arranged at one side of the third sub-pixel, the second sub-pixels in each of the pixel unit groups are arranged at the other side of the third sub-pixel, the third sub-pixels in the pixel unit groups of adjacent rows are arranged in an aligned manner, and two adjacent pixel unit groups in a column and/or row direction are symmetrically distributed with respect to the boundary therebetween.

Alternatively, in the pixel structure, colors of the first sub-pixel, the second sub-pixel, and the third sub-pixel are selected from R, B, or G solo, and colors of the first sub-pixel, the second sub-pixel, and the third sub-pixel are different from each other.

The present disclosure also provides an OLED display screen, comprising any of the foregoing pixel structures.

The present disclosure further provides an evaporation mask, configured to form any of the foregoing pixel structures.

Alternatively, a mask opening of the evaporation mask is a polygon formed by combining at least two right-angled trapezoids.

Alternatively, the mask opening of the evaporation mask has a shape of a hexagon formed by combining lower bottom edges of two right-angled trapezoids, orientations of acute angles of the two right-angled trapezoids are different, and the mask openings in adjacent rows are arranged in a staggered manner.

Alternatively, the mask opening of the evaporation mask has a shape of a pentagon formed by combining lower bottom edges of two right-angled trapezoids, the acute angles of the two right-angled trapezoids has a same orientation and form a tip of the mask opening, the orientations of the tips of the mask openings in adjacent rows are different, and the mask openings in adjacent rows are arranged in a staggered manner.

Alternatively, the mask opening of the evaporation mask has a shape of an isosceles trapezoid formed by combining two right-angled trapezoids, and the mask openings in adjacent rows are arranged in an aligned manner.

Alternatively, the mask opening of the evaporation mask has a shape of a hexagon formed by combining four right-angled trapezoids, and right angles of the four right-angled trapezoids are arranged adjacent to each other.

The present disclosure includes a plurality of pixel unit groups arranged in an array, at least two adjacent first sub-pixels in two adjacent pixel unit groups are formed by a same mask opening in the evaporation mask, and at least two adjacent second sub-pixels in two adjacent pixel unit groups are formed by a same mask opening in the evaporation mask. The aperture ratio or the PPI may be increased based on the allowance produced by sharing one mask opening.

In addition, each pixel unit group includes two first sub-pixels, two second sub-pixels, and one third sub-pixel. Two pixel units in each pixel unit group share one third sub-pixel. By sharing the third sub-pixel, the PPI may be increased.

In addition, the shape of the mask opening of the evaporation mask is a pentagon formed by combining the lower bottom edges of two right-angled trapezoids, the acute angles of the two right-angled trapezoids have the same orientation and form a tip of the mask opening, and the orientations of the tips of the mask openings in adjacent rows are different, which is beneficial to achieve tension dispersion in the stretching process, thereby improving the strength of the evaporation mask.

DETAILED DESCRIPTION

The present disclosure is further described below with reference to the accompanying drawings. Advantages and features of the present disclosure will be apparent from the description and appended claims below.

Figure 1:
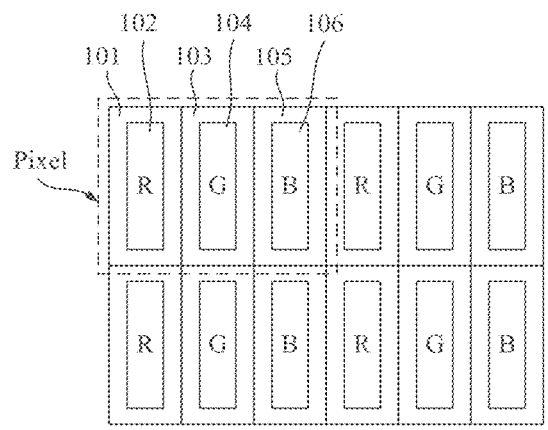
FIG. 1 is a schematic diagram of a pixel structure.
Figure 2:
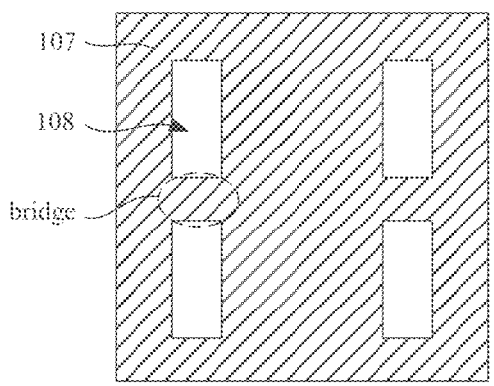
FIG. 2 is a schematic diagram of an FMM corresponding to FIG. 1.
Figure 3:
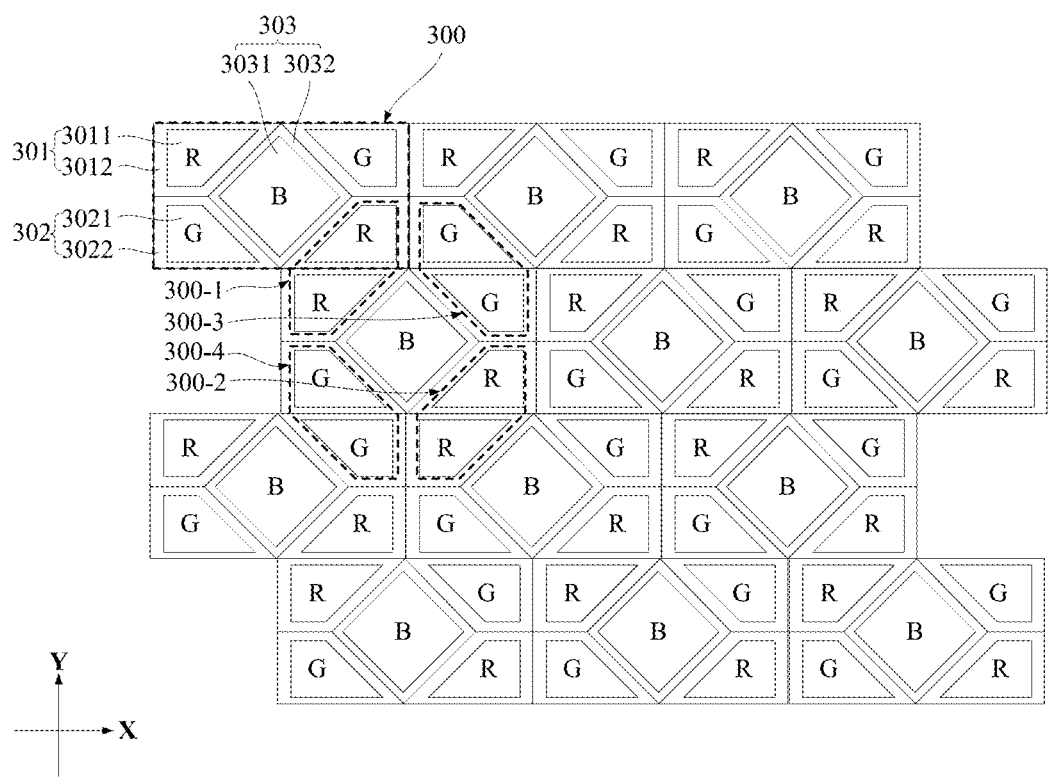
FIG. 3 is a schematic diagram of a pixel structure according to one embodiment of the present disclosure.

FIG. 3 is a schematic diagram showing pixel arrangement of an OLED display screen according to one embodiment of the present disclosure. The X direction refers to the extension direction of each pixel row (also known as the row direction or the horizontal direction), and the Y direction refers to a direction perpendicular to the X direction (also known as the column direction or the vertical direction). For the sake of simplicity, FIG. 3 only shows a part of the OLED display screen. The number of pixels in an actual product is not limited thereto, and the number of pixel units may be changed according to the needs for actual display.

Figure 5:
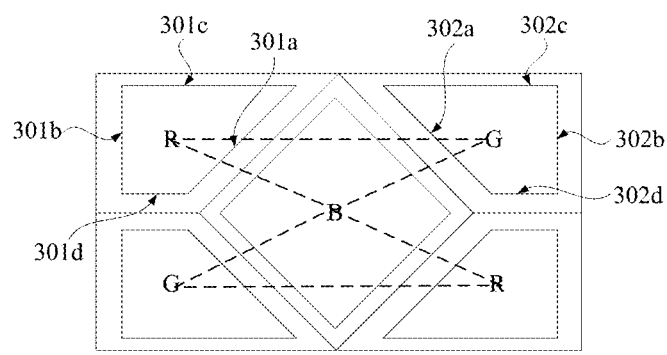
FIG. 5 is another schematic diagram of a pixel unit group in FIG. 3.
Figure 6:
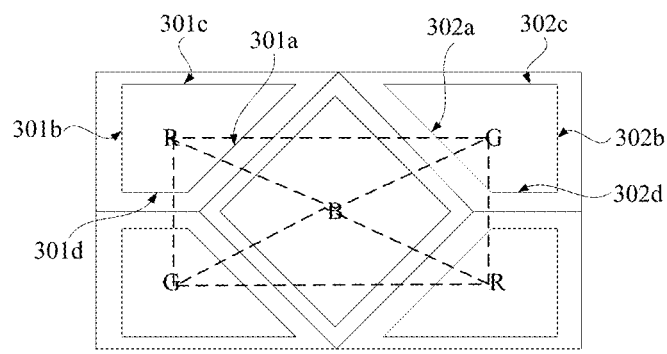
FIG. 6 is another schematic diagram of a pixel unit group in FIG. 3.

As shown in FIG. 3, the pixel structure of the OLED display screen comprises a plurality of pixel unit groups 300 arranged in an array. Each pixel unit group 300 may include two pixel units (shown in a triangular dashed box in FIG. 4 or 5). Each pixel unit group 300 includes two first sub-pixels 301, two second sub-pixels 302, and one third sub-pixel 303. Two pixel units in each pixel unit group 300 share one third sub-pixel 303. By sharing the third sub-pixel 303, the PPI (the number of pixels per inch) may be increased. Each pixel unit group 300 may also be divided into four pixel units (shown in a triangular dashed box in FIG. 6), and the four pixel units share one third sub-pixel 303.

In each pixel unit group 300, the color of the first sub-pixel 301, the second sub-pixel 302, and the third sub-pixel 303 is any of R, G, or B, and the colors of the first sub-pixel 301, the second sub-pixel 302, and the third sub-pixel 303 are different from each other. For example, in FIG. 3, the first sub-pixel 301 is an R sub-pixel, the second sub-pixel 302 is a G sub-pixel, and the third sub-pixel 303 is a B sub-pixel. The first sub-pixel 301 may be a B sub-pixel or a G sub-pixel, the second sub-pixel 302 may be a B sub-pixel or an R sub-pixel, and the third sub-pixel 303 may be a G sub-pixel or a R sub-pixel, as long as the colors of the first sub-pixel 301, the second sub-pixel 302, and the third sub-pixel 303 are different from each other.

Each of the first sub-pixel 301, the second sub-pixel 302, and the third sub-pixel 303 includes a light-emitting region (a display region) and a non-light-emitting region (a non-display region). The light-emitting region of each sub-pixel includes a cathode, an anode, and an electroluminescent layer (also called an organic light-emitting layer), and the electroluminescent layer is located between the cathode and the anode and configured to generate light of a predetermined color to achieve display. As shown in FIG. 3, in this embodiment, the first sub-pixel 301 includes a light-emitting region 3011 and a non-light-emitting region 3012, the second sub-pixel 302 includes a light-emitting region 3021 and a non-light-emitting region 3022, and the third sub-pixel 303 includes a light-emitting region 3031 and a non-light-emitting region 3032. It is generally necessary to utilize a three-time evaporation process to form electroluminescent layers of corresponding colors (e.g., R, G, or B) in the light-emitting regions of the corresponding color pixel regions, respectively.

Figure 4:
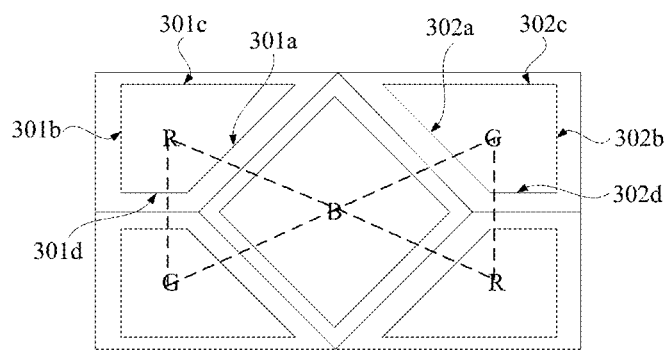
FIG. 4 is a schematic diagram of a pixel unit group in FIG. 3.

As shown in FIGS. 3 and 4, two first sub-pixels 301 and two second sub-pixels 302 in each pixel unit group 300 are alternately arranged around the third sub-pixel 303. For example, a first sub-pixel 301 is arranged at the upper left of the third sub-pixel 303, a second sub-pixel 302 is arranged at the lower left of the third sub-pixel 303, a second sub-pixel 302 is arranged at the upper right of the third sub-pixel 303, and a first sub-pixel 301 is arranged at the lower right of the third sub-pixel 303.

The first sub-pixel 301, the second sub-pixel 302, and the third sub-pixel 303 are all polygonal structures. Each of the first sub-pixel 301 and the second sub-pixel 302 includes a first edge, a second edge, a third edge, and a fourth edge. The first edge is close to the third sub-pixel 303, the second edge is away from the third sub-pixel 303, and the first edge and the second edge are not parallel to each other. In a preferred embodiment, the shape and size of the first sub-pixel 301 and the second sub-pixel 302 are the same. The first sub-pixel 301 and the second sub-pixel 302 are both right-angled trapezoids, and the third sub-pixel 303 is a rhombus. An edge 301a (here referring to the oblique waist of the right-angled trapezoid, i.e., the first edge of the first sub-pixel 301) of the light-emitting region 3011 of the first sub-pixel 301 close to the third sub-pixel 303 is not parallel to an edge 301b (here referring to the right-angled waist of the right-angled trapezoid, i.e., the second edge of the first sub-pixel 301) of the light-emitting region 3011 of the first sub-pixel 301 away from the third sub-pixel 303. An edge 302a (here referring to the oblique waist of the right-angled trapezoid, i.e., the first edge of the second sub-pixel 302) of the light-emitting region 3021 of the second sub-pixel 302 close to the third sub-pixel 303 is not parallel to an edge 302b (here referring to the right-angled waist of the right-angled trapezoid, i.e., the second edge of the second sub-pixel 302) of the light-emitting region 3021 of the second sub-pixel 302 away from the third sub-pixel 303. The edges 301d and 302d (e.g., the upper bottom edge of the right-angled trapezoid), same in properties, of the first sub-pixel 301 and the second sub-pixel 302 adjacent in the column direction (Y direction) are adjacent to each other. Two first sub-pixels 301 and two second sub-pixels 302 surround the third sub-pixel 303 and form a rectangular or square structure.

A certain deformation is allowed in the shapes (and sizes) of the first sub-pixel 301, the second sub-pixel 302, and the third sub-pixel 303. In one aspect, the first sub-pixel 301 and the second sub-pixel 302 may have different shapes, or the first sub-pixel 301 and the second sub-pixel 302 may have the same shape with different sizes (for example, the first sub-pixel 301 and the second sub-pixel 302 are right-angled trapezoids, but the heights of the right-angled trapezoids are different), and the area thereof may be adjusted according to specific application requirements.

Figure 7:
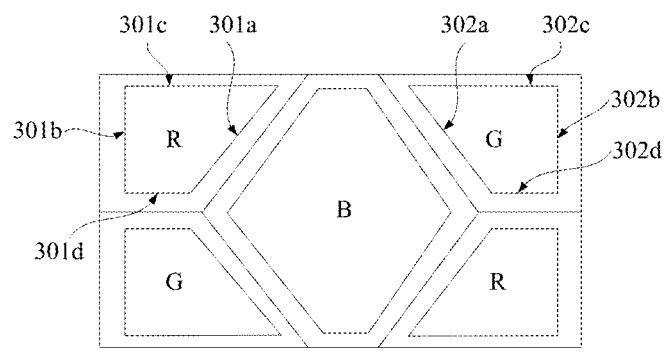
FIG. 7 is another schematic diagram of another pixel unit group according to one embodiment of the present disclosure.
Figure 8:
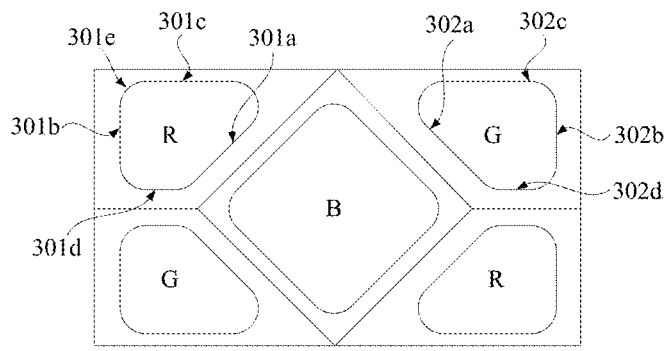
FIG. 8 is another schematic diagram of another pixel unit group according to one embodiment of the present disclosure.

In another aspect, the shapes of the first sub-pixel 301, the second sub-pixel 302, and the third sub-pixel 303 are not limited to the right-angled trapezoid. For example, the first sub-pixel 301 and the second sub-pixel 302 may be approximate right-angled trapezoids (in which the angle between the edges 301b and 301c of the first sub-pixel 301, and the angle between the edges 301b and 301d of the first sub-pixel 310 may be greater than 80 degrees and less than 90 degrees, or greater than 90 degrees and less than 100 degrees). Moreover, the shape of the third sub-pixel 303 may be changed, for example, may be a hexagonal structure, as shown in FIG. 7.

In yet another aspect, two adjacent edges, such as the edges 301b and 301c, respectively of the first sub-pixel 301 and the second sub-pixel 302 may be vertically connected (as shown in FIG. 4), or may be connected in an arc-shaped manner, that is, two adjacent edges 301b and 301c are connected by a curved line segment 301e (as shown in FIG.

Figure 9:
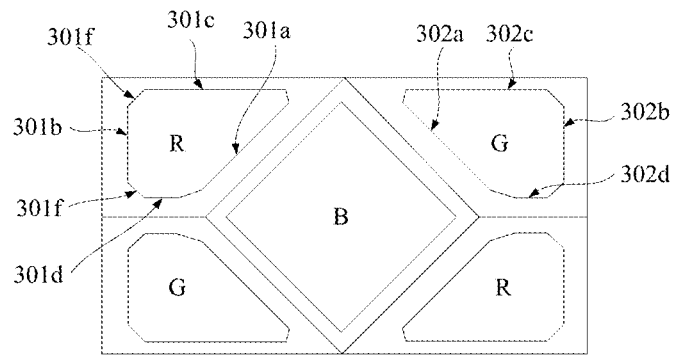
FIG. 9 is another schematic diagram of another pixel unit group according to one embodiment of the present disclosure.
Figure 10:
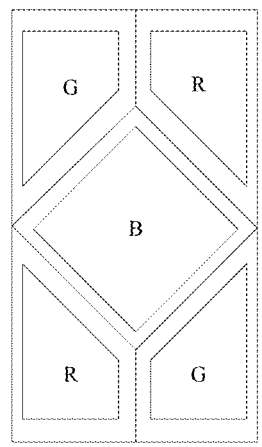
FIG. 10 is another schematic diagram of another pixel unit group according to one embodiment of the present disclosure.

8), or two adjacent edges 301*b* and 301*c* may also be connected by a straight line segment 301*f*, so that the quadrangle is extended to an octagon (as shown in FIG. 9). Two adjacent edges may also be connected by two straight line segments, so that the quadrangle is extended to a dodecagon. Details are not described herein again. In addition, according to the actual needs for design and production, the pixel structure shown in FIG. 3 may be rotated 90 degrees clockwise or counterclockwise to obtain the pixel structure as shown in FIG. 10.

Figure 11:
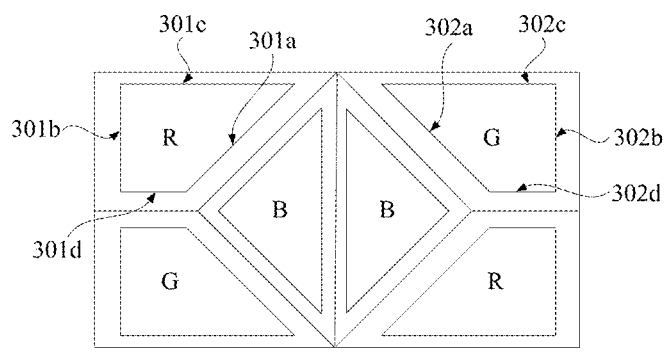
FIG. 11 is another schematic diagram of another pixel unit group according to one embodiment of the present disclosure.
Figure 12:
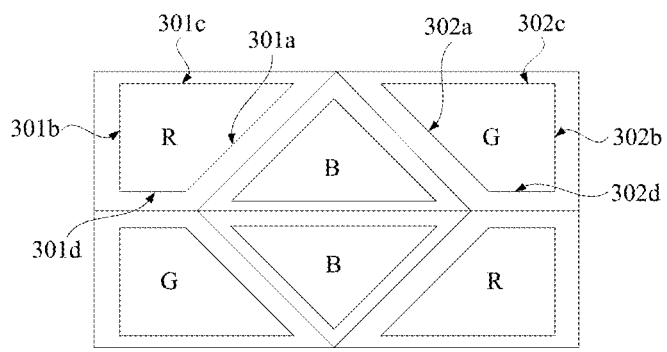
FIG. 12 is another schematic diagram of another pixel unit group according to one embodiment of the present disclosure.

In still another aspect, each pixel unit group 300 may include two first sub-pixels 301, two second sub-pixels 302, and two third sub-pixels 303. Each pixel unit group 300 includes two pixel units. Each pixel unit includes one first sub-pixel 301, one second sub-pixel 302, and one third sub-pixel 303. Two first sub-pixels 301 and two second sub-pixels 302 in each pixel unit group 300 are alternately arranged around two third sub-pixels 303. The first sub-pixel 301 and the second sub-pixel 302 are both right-angled trapezoids, and the third sub-pixel 303 is a triangle (for example, an isosceles triangle). Two third sub-pixels 303 may be arranged along the row direction (as shown in FIG. 11), and two third sub-pixels 303 may also be arranged along the column direction (as shown in FIG. 12).

Still referring to FIG. 3, in this embodiment, the third sub-pixels 303 in the pixel unit groups 300 of adjacent rows are arranged in a staggered (shifted) manner (for example, the third sub-pixels 303 are staggered by a distance half of the pixel unit group). That is, the pixel unit groups 300 of the odd rows are arranged in the same manner, and the pixel unit groups 300 of the even rows are also arranged in the same manner. However, the third sub-pixels 303 in the pixel unit groups of the odd rows are not in alignment with those in the pixel unit groups of the even rows, but are staggered by a distance half of the pixel unit group, that is, the center line of each third sub-pixel in an even row overlaps with the boundary between two adjacent pixel unit groups in an odd row. Moreover, two first sub-pixels 301 respectively in two adjacent pixel unit groups of adjacent rows are arranged adjacent to each other, and two second sub-pixels 302 respectively in two adjacent pixel unit groups of adjacent rows are arranged adjacent to each other. In this case, two adjacent first sub-pixels 301 respectively in two adjacent pixel unit groups are formed by the same mask opening in the evaporation mask, and two adjacent second sub-pixels 302 respectively in two adjacent pixel unit groups are formed by the same mask opening in the evaporation mask. The aperture ratio or the PPI may be increased based on the allowance produced by sharing one mask opening.

In this embodiment, the first sub-pixel at the lower right of the pixel unit group in the N-th row is arranged adjacent to the first sub-pixel at the upper left of the adjacent pixel unit group in the (N+1)-th row (as shown in a dashed box 300-1 in FIG. 3), which may be formed by the same mask opening in the evaporation mask. The first sub-pixel at the lower right of the pixel unit group in the (N+1)-th row is arranged adjacent to the first sub-pixel at the upper left of the adjacent pixel unit group in the (N+2)-th row (as shown in a dashed box 300-2 in FIG. 3), which may be formed by the same mask opening in the evaporation mask, and the rest can be done in the same manner. Similarly, the second sub-pixel at the lower left of the pixel unit group in the N-th row is arranged adjacent to the second sub-pixel at the upper right of the adjacent pixel unit group in the (N+1)-th row (as shown in a dashed box 300-3 in FIG. 3). The second sub-pixel at the lower left of the pixel unit group in the (N+1)-th row is arranged adjacent to the second sub-pixel at the upper right of the adjacent pixel unit group in the (N+2)-th row (as shown in a dashed box 300-4 in FIG. 3), and the rest can be done in the same manner.

Figure 13:
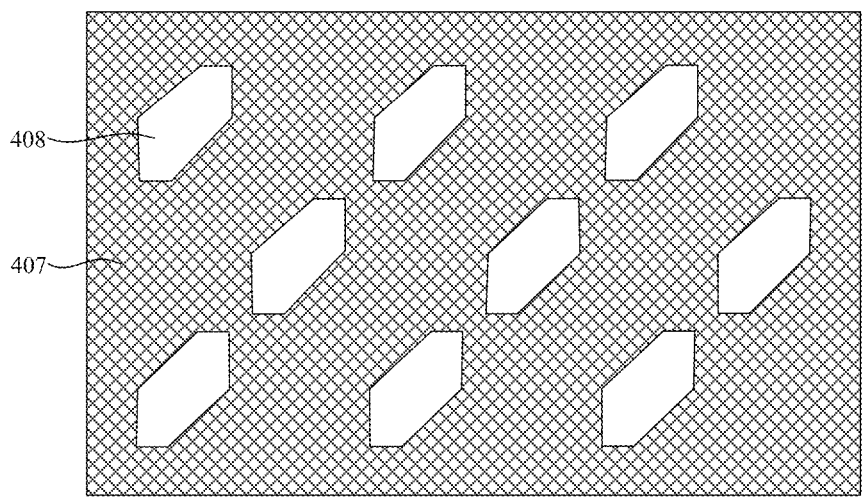
FIG. 13 is a schematic diagram of an FMM corresponding to FIG. 3.

FIG. 13 is a schematic diagram of an FMM corresponding to the pixel structure shown in FIG. 3. As shown in FIG. 13, the FMM includes a shielding region 407 and a plurality of mask openings 408, and the portion of the shielding region between two adjacent mask openings 408 is called a bridge. The mask openings 408 correspond to sub-pixels of the same color (e.g., R) in FIG. 3. In the case that the first sub-pixel and the second sub-pixel have the same shape and size, the first sub-pixel and the second sub-pixel may be arranged in a staggered manner, and achieved by sharing an evaporation mask, so as to save costs.

As shown in FIG. 3, in this embodiment, the first sub-pixel 301 and the second sub-pixel 302 are both right-angled trapezoids. In two adjacent pixel unit groups respectively of adjacent rows, the lower bottom edges of two first sub-pixels 301 are arranged adjacent to each other, and the lower bottom edges of two second sub-pixels 302 are arranged adjacent to each other. Moreover, the orientations of the acute angles of the right-angled trapezoids of the two first sub-pixels 301 are different, and the orientations of the acute angles of the right-angled trapezoids of the two second sub-pixels 302 are different. Correspondingly, as shown in FIG. 13, the shape of the mask opening 408 of the evaporation mask is a hexagon formed by combining the lower bottom edges of two right-angled trapezoids (as shown by the reference sign 300-1 in FIG. 3). The orientations of the acute angles of the right-angled trapezoids of two first sub-pixels 301 are different, the orientations of the acute angles of the right-angled trapezoids of two second sub-pixels 302 are different, and the mask openings in the adjacent rows are arranged in a staggered (shifted) manner. As can be seen from FIG. 13, such a staggered arrangement increases the distance between two closest mask openings 408 respectively in two adjacent rows, so as to increase the strength of the FMM and avoid the occurrence of warping and breakage in the FMM as much as possible, thereby reducing the defects affecting the evaporation quality such as the evaporation film shading and offset.

Figure 14:
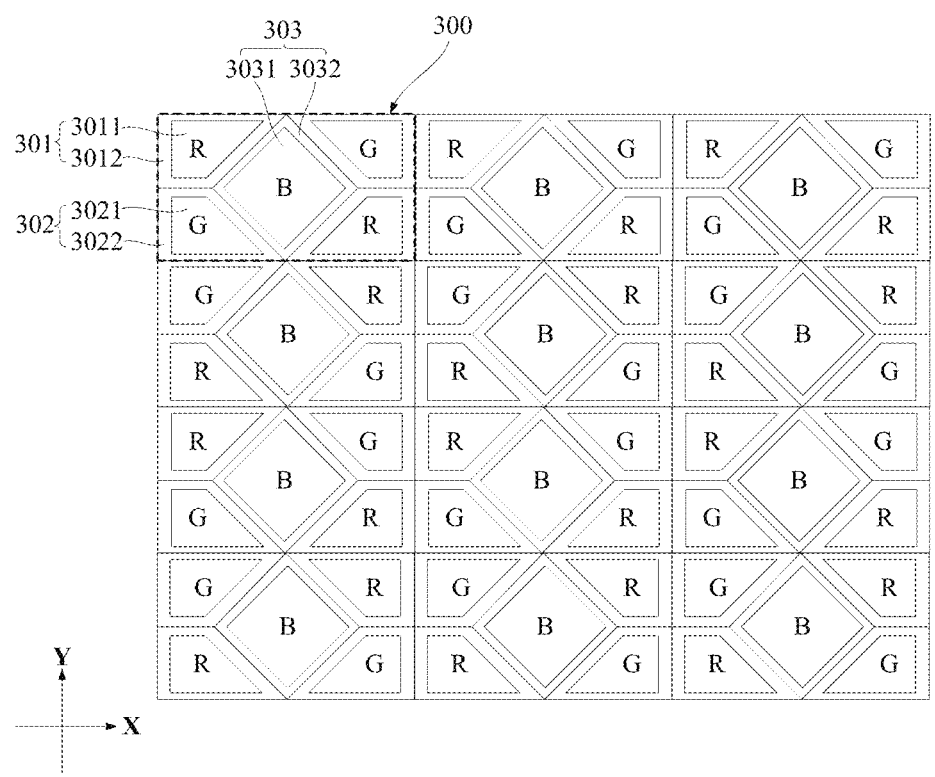
FIG. 14 is a schematic diagram of a pixel structure according to another embodiment of the present disclosure.

FIG. 14 is a schematic diagram showing pixel arrangement of an OLED display screen according to another embodiment of the present disclosure. As shown in FIG. 14, the pixel structure of the OLED display screen comprises a plurality of pixel unit groups 300 arranged in an array. Two first sub-pixels 301 and two second sub-pixels 302 in each pixel unit group 300 are alternately arranged around the third sub-pixel 303, and the third sub-pixels 303 in the pixel unit groups 300 of adjacent rows are arranged in an aligned (direct-facing) manner. Still referring to FIG. 14, two adjacent pixel unit groups 300 in the column direction are symmetrically distributed (mirror-symmetrically distributed) with respect to the boundary therebetween. Specifically, two first sub-pixels 301 respectively of two adjacent pixel unit groups 300 in the column direction are arranged adjacent to each other, and meanwhile, two second sub-pixels 302 respectively of two adjacent pixel unit groups in the column direction are arranged adjacent to each other. In this case, two adjacent first sub-pixels 301 respectively in two adjacent pixel unit groups are formed by the same mask opening in the evaporation mask, and two adjacent second sub-pixels 302 respectively in two adjacent pixel unit groups are formed by the same mask opening in the evaporation mask. The aperture ratio or the PPI may be increased based on the allowance produced by sharing one mask opening.

Figure 15:
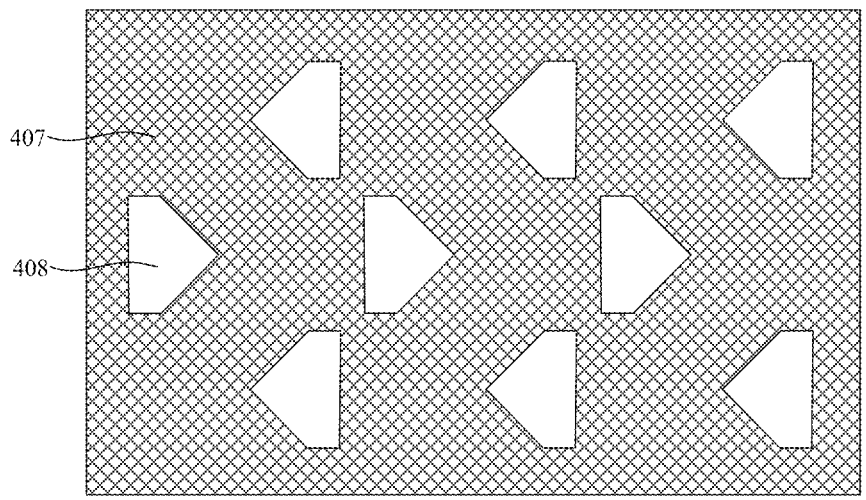
FIG. 15 is a schematic diagram of an FMM corresponding to FIG. 14.

In this embodiment, the first sub-pixel 301 and the second sub-pixel 302 are both right-angled trapezoids. In two adjacent pixel unit groups in the column direction, the lower bottom edges of two first sub-pixels 301 are arranged adjacent to each other, and the lower bottom edges of two second sub-pixels 302 are arranged adjacent to each other. Moreover, the orientations of the acute angles of the right-angled trapezoids of the first sub-pixels 301 are the same, and the orientations of the acute angles of the right-angled trapezoids of the second sub-pixels 302 are the same. Correspondingly, as shown in FIG. 15, the shape of the mask opening 408 of the evaporation mask is a pentagon formed by combining the lower bottom edges of two right-angled trapezoids (as shown by the reference sign 300-1 in FIG. 3). The orientations of the acute angles of the right-angled trapezoid of the first sub-pixels 301 are the same, and the orientations of the acute angles of two right-angled trapezoids of the second sub-pixels 302 are the same. The acute angles of the right-angled trapezoids of the first sub-pixels 301 form a tip of the mask opening, and the acute angles of the right-angled trapezoids of the second sub-pixels 302 forms a tip of the mask opening, and the orientations of the tips of the mask openings on the adjacent rows are different (for example, the tip of the mask opening 408 in the odd row faces leftward, and the tip of the mask opening 408 in the even row faces rightward), that is, the orientations of the mask openings on the adjacent rows are different. Such an opposite design is beneficial to achieve tension dispersion in the stretching process, thereby improving the stability of the evaporation mask.

Furthermore, as can be seen from FIG. 15, the mask openings in the adjacent rows are arranged in a staggered (shifted) manner. Such a staggered arrangement increases the distance between two closest mask openings 408 respectively in two adjacent rows, so as to increase the strength of the FMM and avoid the occurrence of warping and breakage in the FMM as much as possible, thereby reducing the defects affecting the evaporation quality such as the evaporation film shading and offset.

Figure 16:
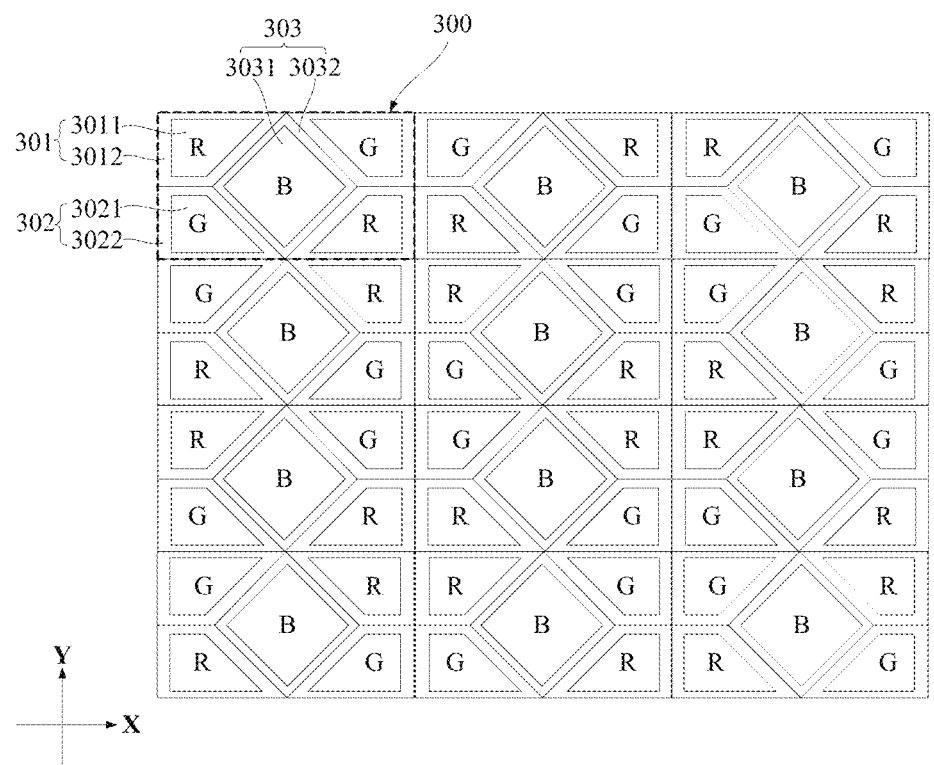
FIG. 16 is a schematic diagram of another pixel structure according to another embodiment of the present disclosure.
Figure 17:
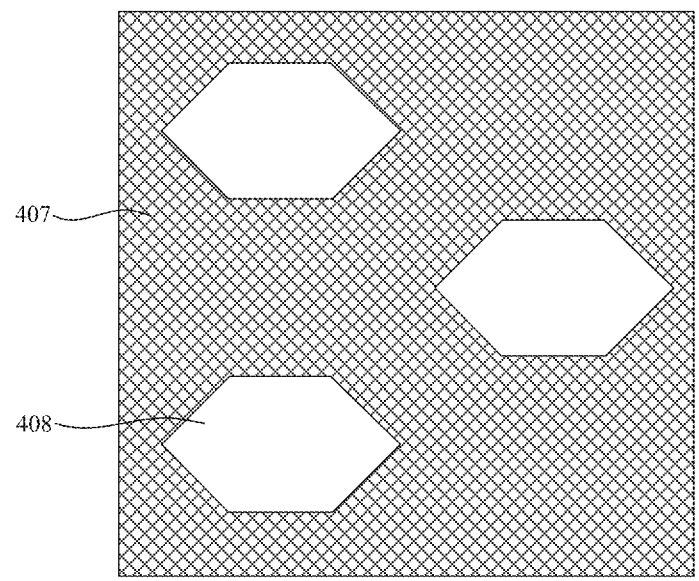
FIG. 17 is a schematic diagram of an FMM corresponding to FIG. 16.

As shown in FIG. 14, two adjacent pixel unit groups 300 in the column direction are symmetrically distributed (mirror-symmetrically distributed) with respect to the boundary therebetween. The pixel unit groups 300 in the same row are arranged in the same manner. However, in the specific implementation, two adjacent pixel unit groups 300 in the same row may also be arranged in different manner, but are symmetrically distributed (mirror-symmetrically distributed) with respect to the boundary therebetween. As shown in FIG. 16, two adjacent pixel unit groups 300 in the row direction or the column direction are mirror-symmetrically distributed. In this case, four adjacent first sub-pixels 301 respectively in four adjacent pixel unit groups are formed by the same mask opening in the evaporation mask, and four adjacent second sub-pixels 302 respectively in four adjacent pixel unit groups are formed by the same mask opening in the evaporation mask. The aperture ratio or the PPI may be increased based on the allowance produced by sharing one mask opening. FIG. 17 is a schematic diagram of an FMM corresponding to FIG. 16. As shown in FIG. 17, the shape of the mask opening 408 of the evaporation mask is a hexagon formed by combining four right-angled trapezoids, and the right angles of the four right-angled trapezoids are arranged adjacent to each other.

Figure 18:
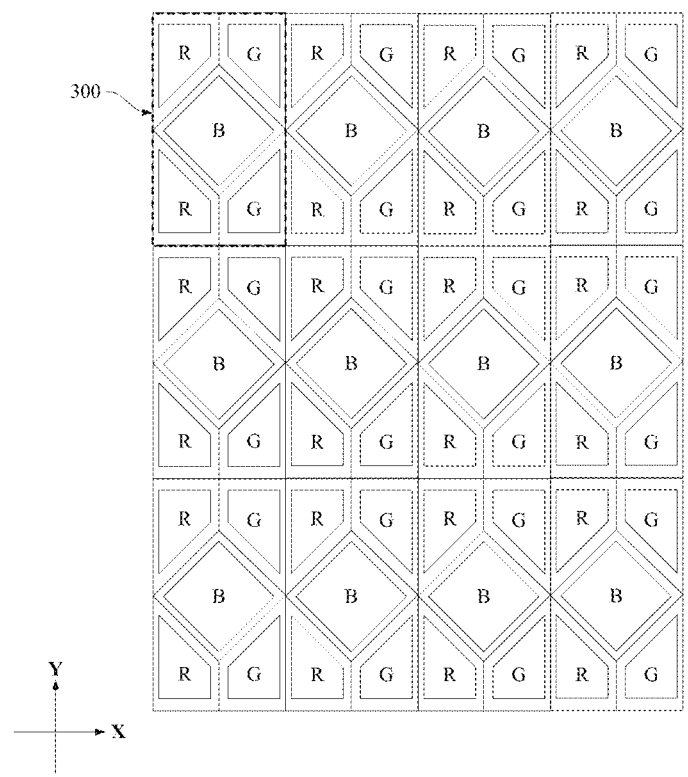
FIG. 18 is a schematic diagram of a pixel structure according to another embodiment of the present disclosure.

FIG. 18 is a schematic diagram showing pixel arrangement of an OLED display screen according to another embodiment of the present disclosure. The pixel structure of the OLED display screen comprises a plurality of pixel unit groups 300 arranged in an array. Two first sub-pixels 301 in each pixel unit group 300 are arranged at one side (such as the left side) of the third sub-pixel 303, and two second sub-pixels 302 in each pixel unit group are arranged at the other side (such as the right side) of the third sub-pixel 303, and the third sub-pixels in the pixel unit groups of adjacent rows are arranged in an aligned manner.

Moreover, two adjacent pixel unit groups 300 in the column direction are symmetrically distributed (mirror-symmetrically distributed) with respect to the boundary therebetween. Specifically, two first sub-pixels 301 respectively in two adjacent pixel unit groups 300 of adjacent rows are arranged adjacent to each other, and two second sub-pixels 302 respectively in two adjacent pixel unit groups of adjacent rows are arranged adjacent to each other. In this case, two adjacent first sub-pixels 301 respectively in two adjacent pixel unit groups are formed by the same mask opening in the evaporation mask, and two adjacent second sub-pixels 302 respectively in two adjacent pixel unit groups are formed by the same mask opening in the evaporation mask. The aperture ratio or the PPI may be increased based on the allowance produced by sharing one mask opening.

Figure 19:
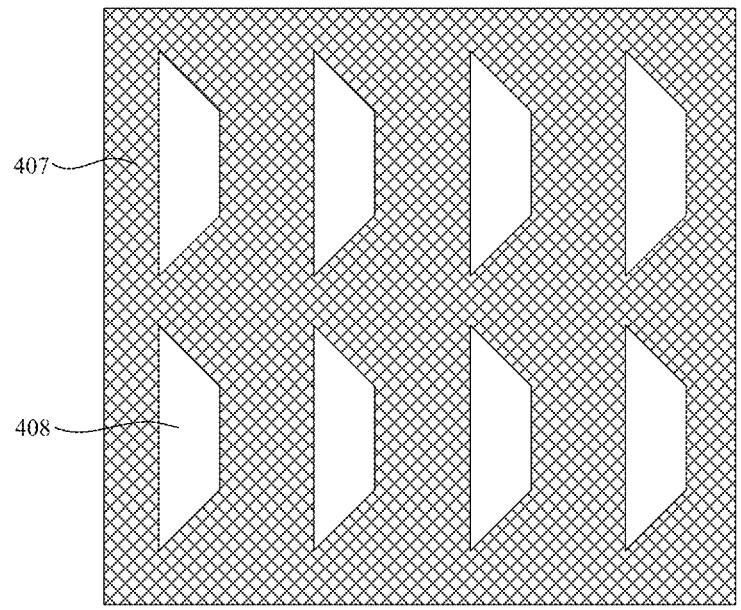
FIG. 19 is a schematic diagram of an FMM corresponding to FIG. 18.

In this embodiment, the first sub-pixel 301 and the second sub-pixel 302 are both right-angled trapezoids. In two adjacent pixel unit groups respectively in the adjacent rows, the right-angled waists of two first sub-pixels 301 are arranged adjacent to each other, and the right-angled waists of two second sub-pixels 302 are arranged adjacent to each other. Moreover, the orientations of the acute angles of the right-angled trapezoids of the two first sub-pixels 301 are different (one upward, and the other downward), and the orientations of the acute angles of the right-angled trapezoids of the two second sub-pixels 302 are different (one upward, and the other downward). Correspondingly, as shown in FIG. 19, the shape of the mask opening 408 of the evaporation mask is an isosceles trapezoid formed by combining two right-angled trapezoids, and the orientations of the mask openings in all rows are the same (that is, all isosceles trapezoids are arranged in the same direction).

Figure 20:
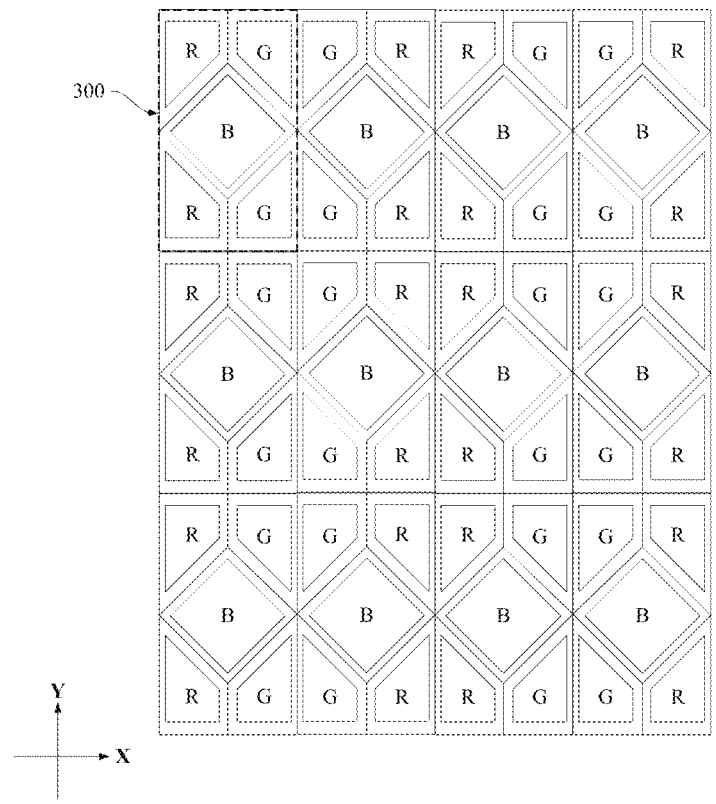
FIG. 20 is a schematic diagram of another pixel structure according to another embodiment of the present disclosure.
Figure 21:
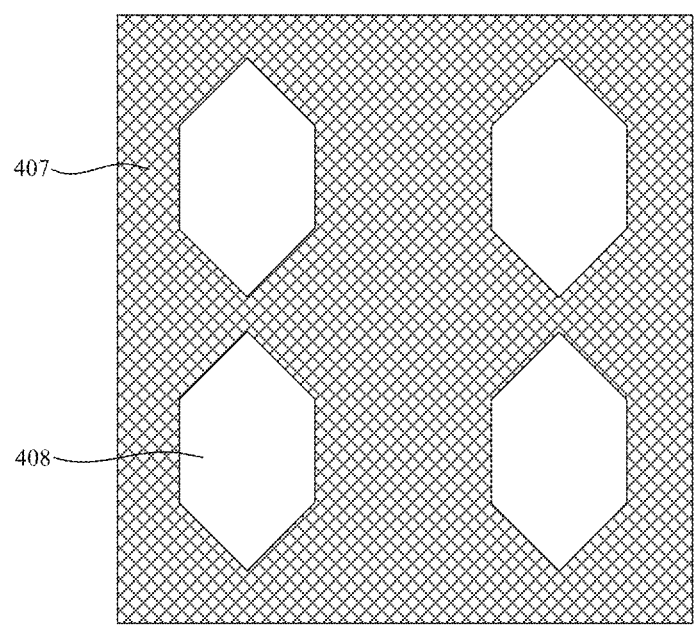
FIG. 21 is a schematic diagram of an FMM corresponding to FIG. 20.

As shown in FIG. 18, two adjacent pixel unit groups 300 in the column direction are symmetrically distributed (mirror-symmetrically distributed) with respect to the boundary therebetween. The pixel unit groups 300 in the same row are arranged in the same manner. However, in the specific implementation, two adjacent pixel unit groups 300 in the same row may also be arranged in different manner. As shown in FIG. 20, two adjacent pixel unit groups 300 in the row direction or the column direction are mirror-symmetrically distributed. In this case, four adjacent first sub-pixels 301 respectively in four adjacent pixel unit groups are formed by the same mask opening in the evaporation mask, and four adjacent second sub-pixels 302 respectively in four adjacent pixel unit groups are formed by the same mask opening in the evaporation mask. The aperture ratio or the PPI may be increased based on the allowance produced by sharing one mask opening. FIG. 21 is a schematic diagram of an FMM corresponding to FIG. 20. As shown in FIG. 21, the shape of the mask opening 408 of the evaporation mask is a hexagon formed by combining four right-angled trapezoids, and the right angles of the four right-angled trapezoids are arranged adjacent to each other.

The embodiments above describe the present disclosure in detail. However, it should be understood that the description above is only illustrative of the preferred embodiments of the present disclosure, and is not intended to limit the scope of the present disclosure. Any changes and modifications made by a person of ordinary skill in the art according to the foregoing disclosure are all within the protection scope of the appended claims.

What is claimed is:

1. A pixel structure, comprising a plurality of pixel unit groups arranged in an array, wherein each of the pixel unit groups comprises a first sub-pixel, a second sub-pixel and a third sub-pixel; an edge of the first sub-pixel close to the third sub-pixel is not parallel to an edge of the first sub-pixel away from the third sub-pixel, and an edge of the second sub-pixel close to the third sub-pixel is not parallel to an edge of the second sub-pixel away from the third sub-pixel;

at least two adjacent first sub-pixels and/or at least two adjacent second sub-pixels of at least two adjacent pixel unit groups are formed by a same mask opening in an evaporation mask; and wherein the first sub-pixel and the second sub-pixel have a shape of right-angled trapezoid, and the third sub-pixel has a shape of rhombus or hexagon; the right-angled trapezoid has an oblique waist close to the third sub-pixel, and the right-angled trapezoid has a right-angled waist away from the third sub-pixel; and each of the pixel unit groups has a shape of rectangle or square.

2. The pixel structure according to claim 1, wherein each of the pixel unit groups comprises two first sub-pixels, two second sub-pixels, and one third sub-pixel; each of the pixel unit groups comprises at least two pixel units formed by one first sub-pixel, one second sub-pixel, and one third sub-pixel; and the pixel units in each of the pixel unit groups share the third sub-pixel.

3. The pixel structure according to claim 1, wherein the first sub-pixel and the second sub-pixel in each of the pixel unit groups are arranged around the third sub-pixel, and the third sub-pixels in the pixel unit groups of adjacent rows are arranged in a staggered manner, in the pixel unit groups of adjacent rows, orientations of acute angles of the right-angled trapezoids of adjacent first pixels are different, and orientations of acute angles of the right-angled trapezoids of adjacent second pixels are different.

4. The pixel structure according to claim 1, wherein the first sub-pixel and the second sub-pixel in each of the pixel unit groups are arranged around the third sub-pixel, the third sub-pixels in the pixel unit groups of adjacent rows are arranged in an aligned manner, and two adjacent pixel unit groups in a column and/or row direction are symmetrically distributed with respect to the boundary therebetween, in the pixel unit groups of adjacent rows, orientations of acute angles of the right-angled trapezoids of adjacent first pixels are same, and orientations of acute angles of the right-angled trapezoids of adjacent second pixels are same.

5. The pixel structure according to claim 1, wherein the first sub-pixel in each of the pixel unit groups is arranged at one side of the third sub-pixel, the second sub-pixel in each of the pixel unit groups is arranged at the other side of the third sub-pixel, the third sub-pixels in the pixel unit groups of adjacent rows are arranged in an aligned manner, and two adjacent pixel unit groups in a column and/or row direction are symmetrically distributed with respect to the boundary therebetween.

6. The pixel structure according to claim 1, wherein colors of the first sub-pixel, the second sub-pixel, and the third sub-pixel are selected from red, blue, or green, and colors of the first sub-pixel, the second sub-pixel, and the third sub-pixel are different from each other.

7. A pixel structure, comprising a plurality of pixel unit groups arranged in an array, wherein each of the pixel unit groups comprises a first sub-pixel, a second sub-pixel and a third sub-pixel; an edge of the first sub-pixel close to the third sub-pixel is not parallel to an edge of the first sub-pixel away from the third sub-pixel, and an edge of the second sub-pixel close to the third sub-pixel is not parallel to an edge of the second sub-pixel away from the third sub-pixel;

at least two adjacent first sub-pixels and/or at least two adjacent second sub-pixels of at least two adjacent pixel unit groups are formed by a same mask opening in an evaporation mask;

wherein the first sub-pixel and the second sub-pixel in each of the pixel unit groups are arranged around the third sub-pixel, and the third sub-pixels in the pixel unit groups of adjacent rows are arranged in a staggered manner.

8. The pixel structure according to claim 7, wherein the third sub-pixels in the pixel unit groups of adjacent rows are staggered by a distance half of the pixel unit group.

9. A pixel structure, comprising a plurality of pixel unit groups arranged in an array, wherein each of the pixel unit groups comprises a first sub-pixel, a second sub-pixel and a third sub-pixel; an edge of the first sub-pixel close to the third sub-pixel is not parallel to an edge of the first sub-pixel away from the third sub-pixel, and an edge of the second sub-pixel close to the third sub-pixel is not parallel to an edge of the second sub-pixel away from the third sub-pixel;

at least two adjacent first sub-pixels and/or at least two adjacent second sub-pixels of at least two adjacent pixel unit groups are formed by a same mask opening in an evaporation mask; wherein the first sub-pixel and the second sub-pixel in each of the pixel unit groups are arranged around the third sub-pixel, the third sub-pixels in the pixel unit groups of adjacent rows are arranged in an aligned manner, and two adjacent pixel unit groups in a column and/or row direction are symmetrically distributed with respect to the boundary therebetween.

10. An evaporation mask, wherein the evaporation mask is configured to form a pixel structure, comprising: a plurality of pixel unit groups arranged in an array, wherein each of the pixel unit groups comprises a first sub-pixel, a second sub-pixel and a third sub-pixel; an edge of the first sub-pixel close to the third sub-pixel is not parallel to an edge of the first sub-pixel away from the third sub-pixel, and an edge of the second sub-pixel close to the third sub-pixel is not parallel to an edge of the second sub-pixel away from the third sub-pixel; and at least two adjacent first sub-pixels and/or at least two adjacent second sub-pixels of at least two adjacent pixel unit groups are formed by a same mask opening in an evaporation mask, and the evaporation mask comprises a plurality of mask openings, wherein the mask opening of the evaporation mask is a polygon formed by combining at least two right-angled trapezoids.

11. The evaporation mask according to claim 10, wherein the mask opening of the evaporation mask has a shape of a hexagon formed by combining lower bottom edges of two right-angled trapezoids, orientations of acute angles of the two right-angled trapezoids are different, and the mask openings in adjacent rows are arranged in a staggered manner.

12. The evaporation mask according to claim 10, wherein the mask opening of the evaporation mask has a shape of a pentagon formed by combining lower bottom edges of two right-angled trapezoids, acute angles of the two right-angled trapezoids has a same orientation and form a tip of the mask opening, the orientations of the tips of the mask openings in adjacent rows are different, and the mask openings in adjacent rows are arranged in a staggered manner.

13. The evaporation mask according to claim 10, wherein the mask opening of the evaporation mask has a shape of an isosceles trapezoid formed by combining two right-angled trapezoids, and the mask openings in adjacent rows are arranged in an aligned manner.

14. The evaporation mask according to claim 10, wherein the mask opening of the evaporation mask has a shape of a hexagon formed by combining four right-angled trapezoids, and right angles of the four right-angled trapezoids are arranged adjacent to each other.

* * * * *